United States Patent
Siekkinen et al.

(10) Patent No.: US 10,060,985 B2
(45) Date of Patent: Aug. 28, 2018

(54) SYSTEM AND METHOD FOR MONITORING TEMPERATURES OF COMPONENTS OF AN ULTRA-CAPACITOR SYSTEM USED WITH AN AUTO START/STOP SYSTEM

(71) Applicant: GM Global Technology Operations LLC, Detroit, MI (US)

(72) Inventors: John W. Siekkinen, Novi, MI (US); Daniel W. Jecks, Wixom, MI (US); Junhong Dai, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 204 days.

(21) Appl. No.: 14/835,858

(22) Filed: Aug. 26, 2015

(65) Prior Publication Data

US 2017/0016419 A1    Jan. 19, 2017

Related U.S. Application Data

(60) Provisional application No. 62/192,712, filed on Jul. 15, 2015.

(51) Int. Cl.
*F02N 11/08* (2006.01)
*G01R 31/36* (2006.01)
(Continued)

(52) U.S. Cl.
CPC .......... *G01R 31/3606* (2013.01); *B60W 10/06* (2013.01); *B60W 30/18018* (2013.01);
(Continued)

(58) Field of Classification Search
CPC ............. B60W 10/06; B60W 30/18018; F02N 11/0825; F02N 11/0866; F02N 2011/0855;
(Continued)

(56) References Cited

U.S. PATENT DOCUMENTS

| | | | | |
|---|---|---|---|---|
| 5,349,931 A | * | 9/1994 | Gottlieb | ............... F02N 11/0807 123/179.2 |
| 2009/0024265 A1 | | 1/2009 | Kortschak et al. | |

(Continued)

FOREIGN PATENT DOCUMENTS

| CN | 102069721 A | 5/2011 |
|---|---|---|
| CN | 104276044 A | 1/2015 |

(Continued)

OTHER PUBLICATIONS

U.S. Appl. No. 14/835,892, filed Aug. 26, 2015, Siekkinen et al.

(Continued)

*Primary Examiner* — Stephen K Cronin
*Assistant Examiner* — Susan Scharpf

(57) ABSTRACT

A system includes an ultra-capacitor and battery system comprising a battery, an ultra-capacitor, a DC-DC converter, a first temperature sensor to sense a battery temperature, a second temperature sensor to sense an ultra-capacitor temperature and a third temperature sensor to sense a DC-DC converter temperature. An auto stop/start module is configured to selectively stop and restart an engine of a vehicle while an ignition system is ON based on operating parameters. A temperature sensing module communicates with the auto stop/start module and is configured to determine differences between temperatures sensed by the first sensor, the second sensor and the third sensor and to selectively disable the auto stop/start module based on the differences.

16 Claims, 5 Drawing Sheets

(51) Int. Cl.
  *B60W 10/06* (2006.01)
  *B60W 30/18* (2012.01)
  *H02J 7/34* (2006.01)

(52) U.S. Cl.
  CPC ...... *F02N 11/0825* (2013.01); *F02N 11/0866* (2013.01); *H02J 7/345* (2013.01); *F02N 2011/0885* (2013.01); *F02N 2011/0888* (2013.01); *F02N 2200/06* (2013.01); *F02N 2200/064* (2013.01); *F02N 2250/02* (2013.01); *Y02T 10/48* (2013.01)

(58) Field of Classification Search
  CPC ......... F02N 2011/0888; F02N 2200/06; F02N 2200/064; F02N 2250/02; Y02T 10/48; G01R 31/3606; H02J 7/00
  USPC .......................................... 701/102, 112, 113
  See application file for complete search history.

(56) References Cited

U.S. PATENT DOCUMENTS

| | | | |
|---|---|---|---|
| 2009/0050092 A1* | 2/2009 | Handa | F02N 11/0866 123/179.3 |
| 2009/0115419 A1 | 5/2009 | Ueda et al. | |
| 2009/0284022 A1* | 11/2009 | Usselman | F02D 29/06 290/38 R |
| 2010/0031911 A1* | 2/2010 | Gessier | F02D 41/064 123/179.21 |
| 2010/0100248 A1 | 4/2010 | Minto et al. | |
| 2010/0116574 A1* | 5/2010 | Gilmore | B60K 6/28 180/65.285 |
| 2011/0090726 A1* | 4/2011 | Brotto | H02J 7/0065 363/131 |
| 2011/0273141 A1* | 11/2011 | Kanbayashi | B60K 6/48 320/134 |
| 2012/0062186 A1* | 3/2012 | Dessirier | B60K 6/28 320/167 |
| 2012/0095644 A1* | 4/2012 | Dessirier | B60L 11/005 701/36 |
| 2012/0221301 A1 | 8/2012 | Umeda et al. | |
| 2013/0106180 A1 | 5/2013 | Akimasa et al. | |
| 2013/0289854 A1* | 10/2013 | Takahashi | B60L 11/1809 701/112 |
| 2014/0067241 A1 | 3/2014 | Yuhara et al. | |
| 2014/0132002 A1 | 5/2014 | Watanabe et al. | |
| 2015/0001857 A1* | 1/2015 | Sekiguchi | B60L 7/10 290/38 C |
| 2015/0032314 A1* | 1/2015 | Kitamura | E02F 9/123 701/22 |
| 2015/0253749 A1 | 9/2015 | Kniazev et al. | |
| 2016/0146173 A1 | 5/2016 | Mars et al. | |
| 2017/0016419 A1 | 1/2017 | Siekkinen et al. | |
| 2017/0018126 A1 | 1/2017 | Siekkinen et al. | |

FOREIGN PATENT DOCUMENTS

| | | |
|---|---|---|
| CN | 204089238 U | 1/2015 |
| CN | 104487303 A | 4/2015 |
| FR | 2903057 B1 | 2/2009 |
| JP | 2007309100 A | 11/2007 |
| JP | 2009180125 A | 8/2009 |
| JP | 2011047380 A | 3/2011 |

OTHER PUBLICATIONS

U.S. Appl. No. 14/835,826, filed Aug. 26, 2015, Siekkinen et al.
First Office Action for Chinese Application No. 201610500374.9 dated Dec. 11, 2017 with English translation; 12 pages.

* cited by examiner

SYSTEM AND METHOD FOR MONITORING TEMPERATURES OF COMPONENTS OF AN ULTRA-CAPACITOR SYSTEM USED WITH AN AUTO START/STOP SYSTEM

CROSS-REFERENCE TO RELATED APPLICATIONS

This application claims the benefit of U.S. Provisional Application No. 62/192,712, filed on Jul. 15, 2015. The entire disclosures of the applications referenced above are incorporated herein by reference.

FIELD

The present disclosure relates to control systems for vehicles, and more particularly systems and methods for monitoring temperatures of components of an ultra-capacitor system in an auto stop/start system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Internal combustion engines combust an air and fuel mixture within cylinders to drive pistons, which produces drive torque. Air flow into gasoline engines is regulated via a throttle. More specifically, the throttle adjusts throttle area, which increases or decreases air flow into the engine. As the throttle area increases, the air flow into the engine increases. A fuel control system adjusts the rate that fuel is injected to provide a desired air/fuel mixture to the cylinders. Increasing the amount of air and fuel provided to the cylinders increases the torque output of the engine.

A vehicle may include an auto stop/start system that increases the vehicle's fuel efficiency. The auto stop/start system increases fuel efficiency by selectively shutting down the engine and disabling the flow of fuel to the engine while the ignition system of the vehicle is ON. While the engine is shut down, the auto stop/start system automatically starts the engine when one or more start-up conditions are satisfied.

In some circumstances, battery voltage dips during an auto start event after an auto stop event. While some systems such as an engine controller may be designed to handle the battery voltage dips, other vehicle systems such as a transmission controller or other controllers may not be as robust. When the battery voltage dips during an auto start event, these other controllers may enter into a reset mode of operation and/or cause other drivability issues.

SUMMARY

A system includes an ultra-capacitor and battery system comprising a battery, an ultra-capacitor, a DC-DC converter, a first temperature sensor to sense a battery temperature, a second temperature sensor to sense an ultra-capacitor temperature and a third temperature sensor to sense a DC-DC converter temperature. An auto stop/start module is configured to selectively stop and restart an engine of a vehicle while an ignition system is ON based on operating parameters. A temperature sensing module communicates with the auto stop/start module and is configured to determine differences between temperatures sensed by the first sensor, the second sensor and the third sensor and to selectively disable the auto stop/start module based on the differences.

In other features, a first switch has a first terminal connected to the battery and a second terminal connected to chassis ground. A second switch has a first terminal connected to the battery and a second terminal connected to the ultra-capacitor. An ultra-capacitor controller is configured to control the first switch and the second switch.

In other features, the temperature sensing module generates the differences after a predetermined engine-off soak period. The differences are absolute values. The temperature sensing module compares the differences to predetermined difference thresholds.

In other features, an engine control module includes the auto stop/start module and the temperature sensing module. The engine control module generates the differences after a predetermined engine-off soak period.

In other features, the temperature sensing module compares the temperatures sensed by the first sensor, the second sensor and the third sensor to a first predetermined range, a second predetermined range and a third predetermined range, respectively, and selectively disables the auto stop/start module based on the comparison. The ultra-capacitor and battery system further comprises an ultra-capacitor controller. An engine control module includes the auto stop/start module and the temperature sensing module. A bus is arranged between the engine control module and the ultra-capacitor controller.

A method includes providing an ultra-capacitor and battery system comprising a battery, an ultra-capacitor, a DC-DC converter; sensing a battery temperature, an ultra-capacitor temperature and a DC-DC converter temperature; selectively performing auto stop/start by stopping an engine of a vehicle and restarting the engine of a vehicle while an ignition system is ON; determining differences between the battery temperature, the ultra-capacitor temperature and the DC-DC converter temperature; and selectively disabling the auto stop/start based on the differences.

In other features, the differences are absolute values. The method includes comparing the differences to predetermined thresholds. The method includes generating the differences after a predetermined engine-off soak period. The method includes comparing the battery temperature, the ultra-capacitor temperature and the DC-DC converter temperature to a first predetermined range, a second predetermined range and a third predetermined range, respectively; and selectively disabling the auto stop/start based on the comparison.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

An engine control module and starter selectively start and stop an engine of a vehicle in response to vehicle startup and shutdown commands from the operator (e.g., transitioning an ignition key or start button to "ON" or to "OFF"). The control module may also automatically initiate auto stop events and auto start events between the vehicle startup command and the vehicle shutdown command while the ignition key is "ON".

The control module may selectively initiate an auto stop event and shut down the engine, for example, when the vehicle is stopped while the driver applies pressure to a brake pedal and/or other enabling conditions are present. The control module may selectively initiate an auto start event and re-start the engine when the driver removes pressure from the brake pedal and/or other enabling conditions are present.

Systems and methods according to the present disclosure include an ultra-capacitor system to assist the battery during auto start events. The systems and methods described herein monitor the temperature of components of the ultra-capacitor system. If the monitored temperatures do not meet temperature performance criteria, one or more fault codes may be set and auto stop/start events may be disabled for the trip. As used herein, the term 'trip' refers to the period between an ignition ON event and an ignition OFF event.

The temperature sensor diagnostic systems and methods described herein provide confirmation that the sensed temperatures can be reliably used (such as for onboard diagnostic (OBD) compliant systems). The temperature diagnostic systems and methods described herein evaluate the temperatures of the sensors after a predetermined soak period. For example only, the temperature sensors generally have the same temperature (usually equal to the ambient environment) after a soak period of about eight hours or more. The temperature sensor diagnostic systems and methods described herein check for circuit, connector and/or sensor issues that may cause invalid or irrational temperature values to be generated during operation. In some examples, if an invalid temperature reading occurs, the auto stop/start system may be disabled for the trip.

During operation, the ultra-capacitor is charged to store energy. After the charge operation is complete, auto stop events are allowed. When an auto start event occurs, the ultra-capacitor releases the stored energy to reduce battery voltage dips. Reducing the battery voltage dips allows the auto stop/start system to operate in additional situations. For example, use of the ultra-capacitor allows the auto stop/start system to work at lower temperatures. As a result of the increased use of the auto stop/start system, fuel economy is improved.

Figure 1:
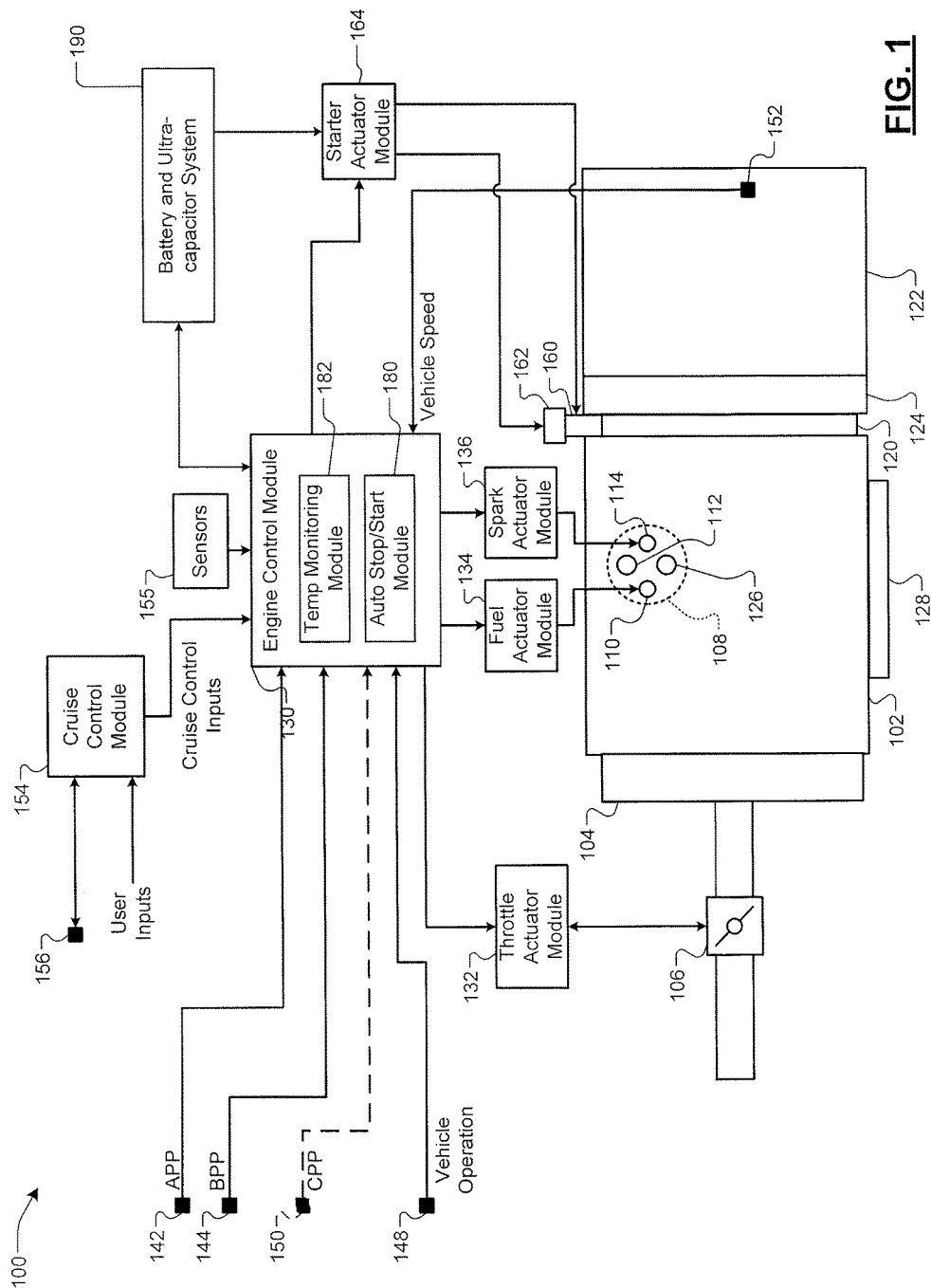
FIG. 1 is a functional block diagram of an example of an engine control system including an auto stop/start system and a battery and ultra-capacitor system according to the present disclosure.

Referring now to FIG. 1, a functional block diagram of an example engine system 100 is presented. The engine system 100 includes an engine 102 that combusts an air/fuel mixture to produce drive torque for a vehicle. Air is drawn into an intake manifold 104 through a throttle valve 106. The throttle valve 106 regulates air flow into the intake manifold 104. Air within the intake manifold 104 is drawn into one or more cylinders of the engine 102, such as cylinder 108.

One or more fuel injectors, such as fuel injector 110, inject fuel that mixes with air to form an air/fuel mixture. In various implementations, one fuel injector may be provided for each cylinder of the engine 102. The fuel injectors may be associated with an electronic or mechanical fuel injection system, a jet or port of a carburetor, or another fuel injection system. The fuel injectors may be controlled to provide a desired air/fuel mixture for combustion, such as a stoichiometric air/fuel mixture.

An intake valve 112 opens to allow air into the cylinder 108. A piston (not shown) compresses the air/fuel mixture within the cylinder 108. In some engine systems, a spark plug 114 initiates combustion of the air/fuel mixture within the cylinder 108. In other types of engine systems, such as diesel engine systems, combustion may be initiated without the spark plug 114.

Combustion of the air/fuel mixture applies force to the piston, which rotatably drives a crankshaft (not shown). The engine 102 outputs torque via the crankshaft. A flywheel 120 is coupled to the crankshaft and rotates with the crankshaft. Torque output by the engine 102 is selectively transferred to a transmission 122 via a torque transfer device 124. More specifically, the torque transfer device 124 selectively couples the transmission 122 to the engine 102 and de-couples the transmission 122 from the engine 102. The torque transfer device 124 may include, for example, a torque converter and/or one or more clutches. The transmission 122 may include, for example, a manual transmission, an automatic transmission, a semi-automatic transmission, an auto-manual transmission, or another suitable type of transmission.

Exhaust produced by combustion of the air/fuel mixture is expelled from the cylinder 108 via an exhaust valve 126. The exhaust is expelled from the cylinders to an exhaust system 128. The exhaust system 128 may treat the exhaust before the exhaust is expelled from the exhaust system 128. Although one intake and exhaust valve are shown and described as being associated with the cylinder 108, more than one intake and/or exhaust valve may be associated with each cylinder of the engine 102.

An engine control module (ECM) 130 controls the torque output of the engine 102. For example only, the ECM 130 may control the torque output of the engine 102 via various engine actuators. The engine actuators may include, for example, a throttle actuator module 132, a fuel actuator module 134, and a spark actuator module 136. The engine system 100 may also include other engine actuators, and the ECM 130 may control the other engine actuators.

Each engine actuator controls an operating parameter based on a signal from the ECM 130. For example only, the throttle actuator module 132 may control opening of the throttle valve 106, the fuel actuator module 134 may control amount and timing of fuel injection, and the spark actuator module 136 may control spark timing.

The ECM 130 may control the torque output of the engine 102 based on, for example, driver inputs and various other inputs. The other inputs may include, for example, inputs from a transmission system, inputs from a hybrid control system, inputs from a stability control system, inputs from a chassis control system, and other suitable vehicle systems.

The driver inputs may include, for example, an accelerator pedal position (APP), a brake pedal position (BPP), and vehicle operation commands. An APP sensor 142 measures position of an accelerator pedal (not shown) and generates the APP based on the position. A BPP sensor 144 monitors actuation of a brake pedal (not shown) and generates the BPP accordingly. The vehicle operation commands may be made via actuation of, for example, an ignition key, one or more ignition buttons/switches, and/or one or more suitable vehicle ignition system inputs 148. In vehicles having a manual transmission, the driver inputs provided to the ECM 130 may also include a clutch pedal position (CPP). A CPP sensor 150 monitors actuation of a clutch pedal (not shown) and generates the CPP accordingly.

In some implementations, the APP sensor 142, the BPP sensor 144, and the CPP sensor 150 may measure the position of the associated pedal and generate the APP, the BPP, and the CPP signals, respectively, based on the measured position of the associated pedal. In other implementations, the APP sensor 142, the BPP sensor 144, and the CPP sensor 150 may each include one or more switches and may generate the APP, the BPP, and the CPP, respectively, indicating whether the associated pedal is being actuated away from a predetermined resting position. While the APP sensor 142, the BPP sensor 144, and the CPP sensor 150 are shown and described, one or more additional APP, BPP, and/or CPP sensors may be provided.

The driver inputs may also include one or more cruise control inputs. A cruise control module 154 may provide cruise control inputs to the ECM 130 based on user inputs and vehicle surroundings inputs. The user inputs may include, for example, a speed set input, a cruise control on/off input, a resume speed input, and/or one or more suitable user inputs.

The ECM 130 may selectively make control decisions for the engine system 100 based on one or more parameters. A vehicle speed sensor 152 measures speed of the vehicle and generates a vehicle speed signal. For example only, the vehicle speed sensor 152 may generate the vehicle speed based on a transmission output shaft speed (TOSS), one or more wheel speeds, and/or another suitable measure of the vehicle speed. The ECM 130 may also receive operating parameters measured by other sensors 155, such as oxygen in the exhaust, engine speed, engine coolant temperature, intake air temperature, mass air flowrate, oil temperature, manifold absolute pressure, and/or other suitable parameters.

The ECM 130 selectively shuts down the engine 102 when a vehicle shutdown command is received. For example only, the ECM 130 may disable the injection of fuel, disable the provision of spark, and perform other engine shutdown operations to shut down the engine 102 when a vehicle shutdown command is received.

While the engine 102 is cranked pursuant to the receipt of a vehicle startup command (e.g., the ignition key is transitioned ON), a starter motor 160 is selectively engaged with the engine 102 to crank the engine and to initiate a startup event. For example only, the starter motor 160 may be engaged with the engine 102 when a vehicle startup command is received. The starter motor 160 may engage the flywheel 120 or other suitable component(s) that may drive rotation of the crankshaft.

A starter motor actuator 162, such as a solenoid, selectively engages the starter motor 160 with the engine 102. A starter actuator module 164 controls the starter motor actuator 162, and therefore the starter motor 160, based on signals from the ECM 130. For example only, the ECM 130 may command engagement of the starter motor 160 when the vehicle startup command is received.

The starter actuator module 164 selectively applies current to the starter motor 160 when the starter motor 160 is engaged with the engine 102. For example only, the starter actuator module 164 may include a starter relay. The application of current to the starter motor 160 drives rotation of the starter motor 160, and the engaged portion of the starter motor 160 drives rotation of the crankshaft. Driving rotation of the crankshaft to start the engine 102 may be referred to as engine cranking.

Once the engine 102 is deemed running after the engine startup event, the starter motor 160 may be disengaged from the engine 102, and the flow of current to the starter motor 160 may be discontinued. The engine 102 may be deemed running, for example, when the engine speed exceeds a predetermined speed, such as a predetermined idle speed. For example only, the predetermined idle speed may be approximately 700 rpm. Engine cranking may be said to be completed when the engine 102 is deemed running. Current provided to the starter motor 160 may be provided by, for example, a battery and ultra-capacitor system 190.

Other than commanded vehicle startups and vehicle shutdowns, the ECM 130 may include an auto stop/start module 180 that selectively initiates auto stop events and auto start events of the engine 102. An auto stop event includes shutting down the engine 102 when one or more predetermined auto stop criteria are satisfied when vehicle shutdown has not been commanded (e.g., while the ignition key remains ON). The engine 102 may be shut down and the provision of fuel to the engine 102 may be disabled, for example, to increase fuel economy (by decreasing fuel consumption).

While the engine 102 is shut down during an auto stop event, the auto stop/start module 180 may selectively initiate an auto-start event. An auto-start event may include, for example, supplying fuel to the engine 102, supplying spark, engaging the starter motor 160 with the engine 102, and applying current to the starter motor 160 to start the engine 102.

The auto stop/start module 180 may selectively initiate auto stop events and auto start events, for example, based on the APP, the BPP, the vehicle speed, the CPP, the voltage state of the battery, the charge state of the ultra-capacitor and/or one or more other suitable parameters. For example only, the auto stop/start module 180 may initiate an auto-stop event when the brake pedal is depressed and the vehicle speed is less than a predetermined speed. While the engine 102 is shut down for the auto stop event, the auto stop/start module 180 may selectively initiate an auto start event when the brake pedal is released.

A temperature monitoring module 182 communicates with the battery and ultra-capacitor system 190 and performs monitoring of temperatures of components of the battery and ultra-capacitor system 190 as will be described further below.

Figure 2:
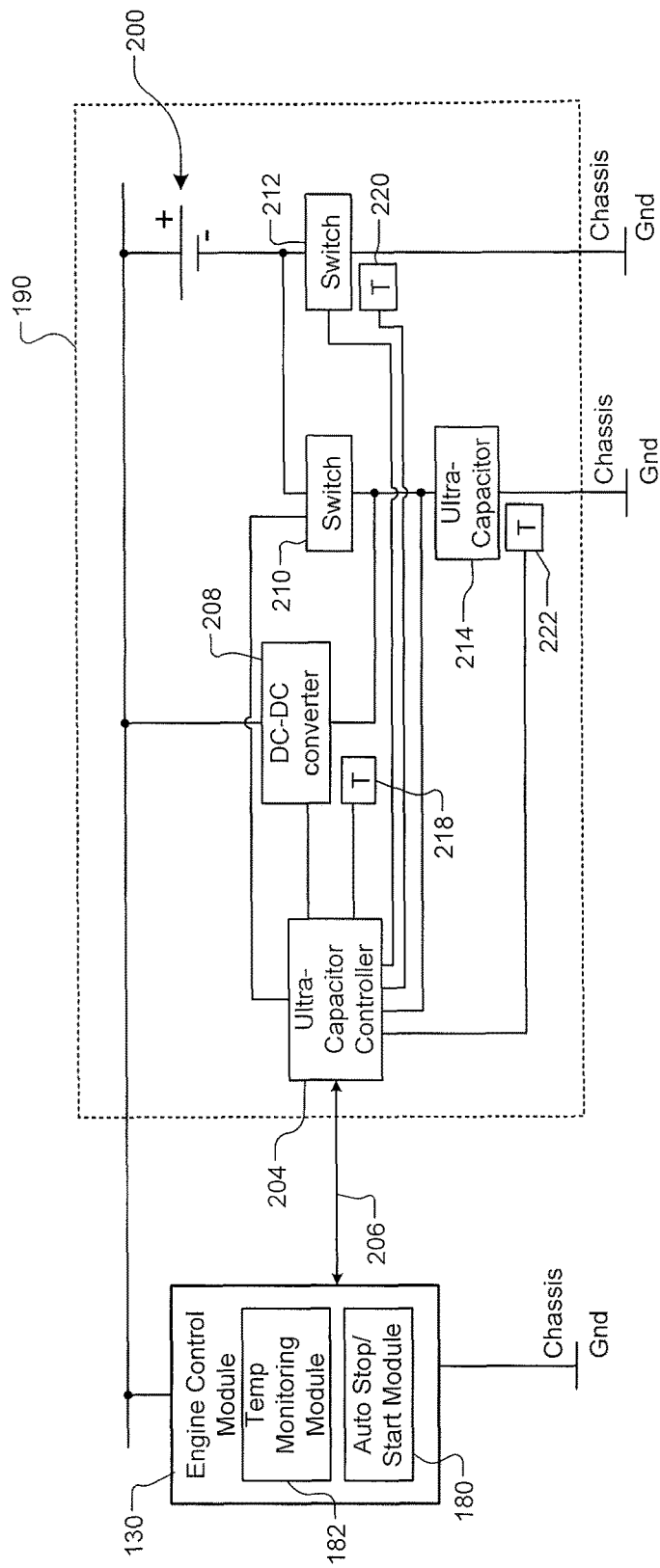
FIG. 2 is a functional block diagram of an example of the battery and ultra-capacitor system of FIG. 1.

Referring now to FIG. 2, the battery and ultra-capacitor system 190 includes a battery 200, an ultra-capacitor controller 204, a DC-DC converter 208, switches 210 and 212, an ultra-capacitor 214, and temperature sensors 218, 220 and 222. The engine control module 130 may be connected to the ultra-capacitor controller 204 by a bus 206. In some examples, the bus 206 includes a local interconnect network (LIN) bus, although other types of buses may be used.

The DC-DC converter 208 includes a first terminal connected to a first terminal of the battery 201 and a second terminal connected between the switch and the ultra-capacitor 214. The switch 210 is connected between a second terminal of the battery 200 and a first terminal of the ultra-capacitor 214. The switch 212 is connected between the negative terminal of the battery 200 and chassis ground. The second terminal of the ultra-capacitor 214 is connected to chassis ground. The ultra-capacitor controller 204 is connected to the DC-DC converter 208, the temperature sensors 218, 220 and 222, and the switches 210 and 212. In addition, the ultra-capacitor controller 204 communicates with the engine control module 206.

During operation, the switch 212 is typically closed to connect the battery 200 to chassis ground and the switch 210 is open. During auto start events, the switch 210 is selectively closed and switch 212 is opened to provide assistance from the ultra-capacitor 214 to the battery 200 to prevent voltage dips. During charging, the DC-DC converter 208 supplies power from the battery 200 to the ultra-capacitor 214 to charge the ultra-capacitor 214. The temperature sensors 218, 220 and 222 monitor temperatures of the DC-DC converter 208, the switch 212 and the ultra-capacitor 214, respectively.

Figure 3:
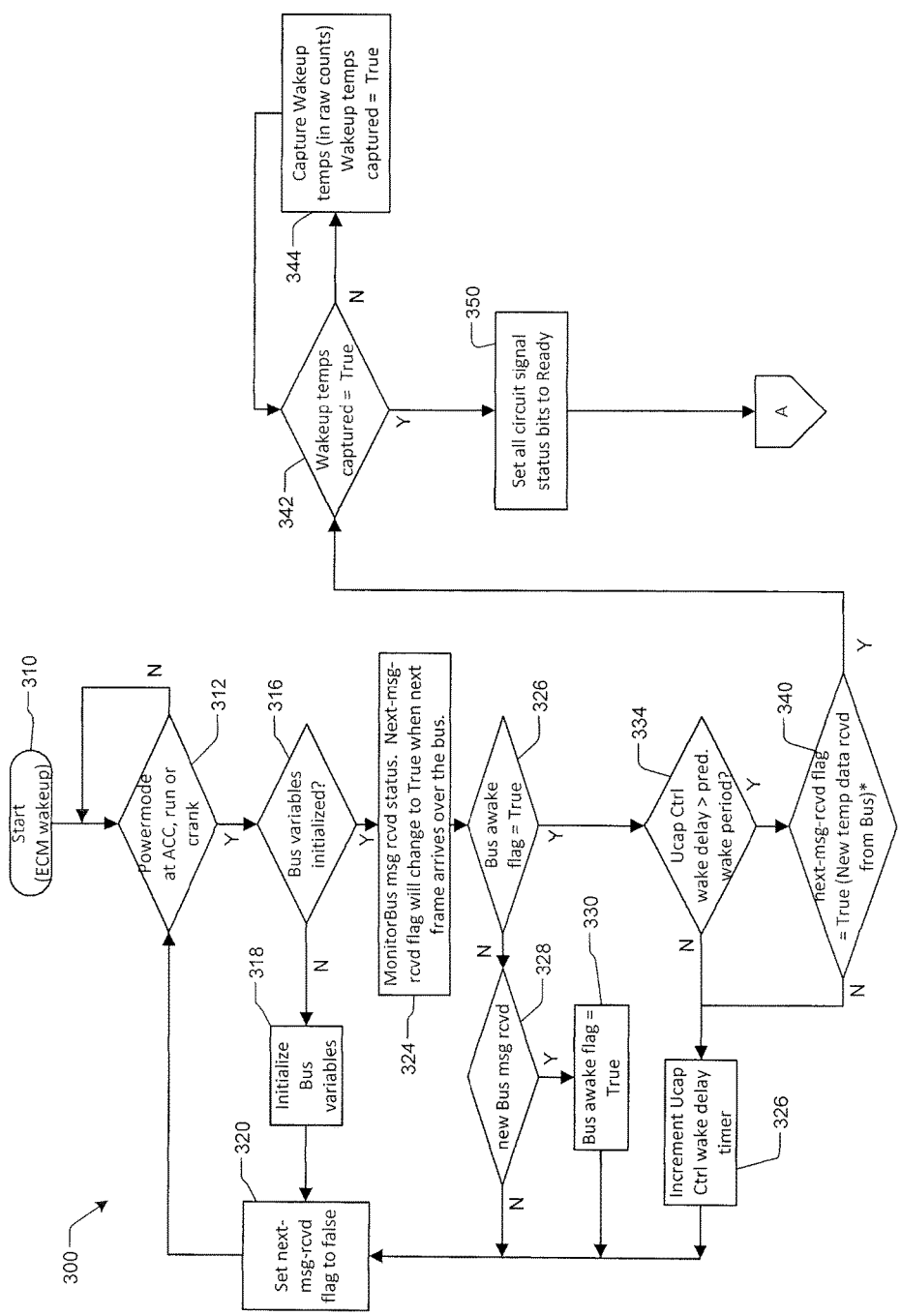
FIGS. 3-5 are flowcharts illustrating an example of a method for monitoring temperatures of components of an ultra-capacitor system used with an auto stop/start system according to the present disclosure.
Figure 4:
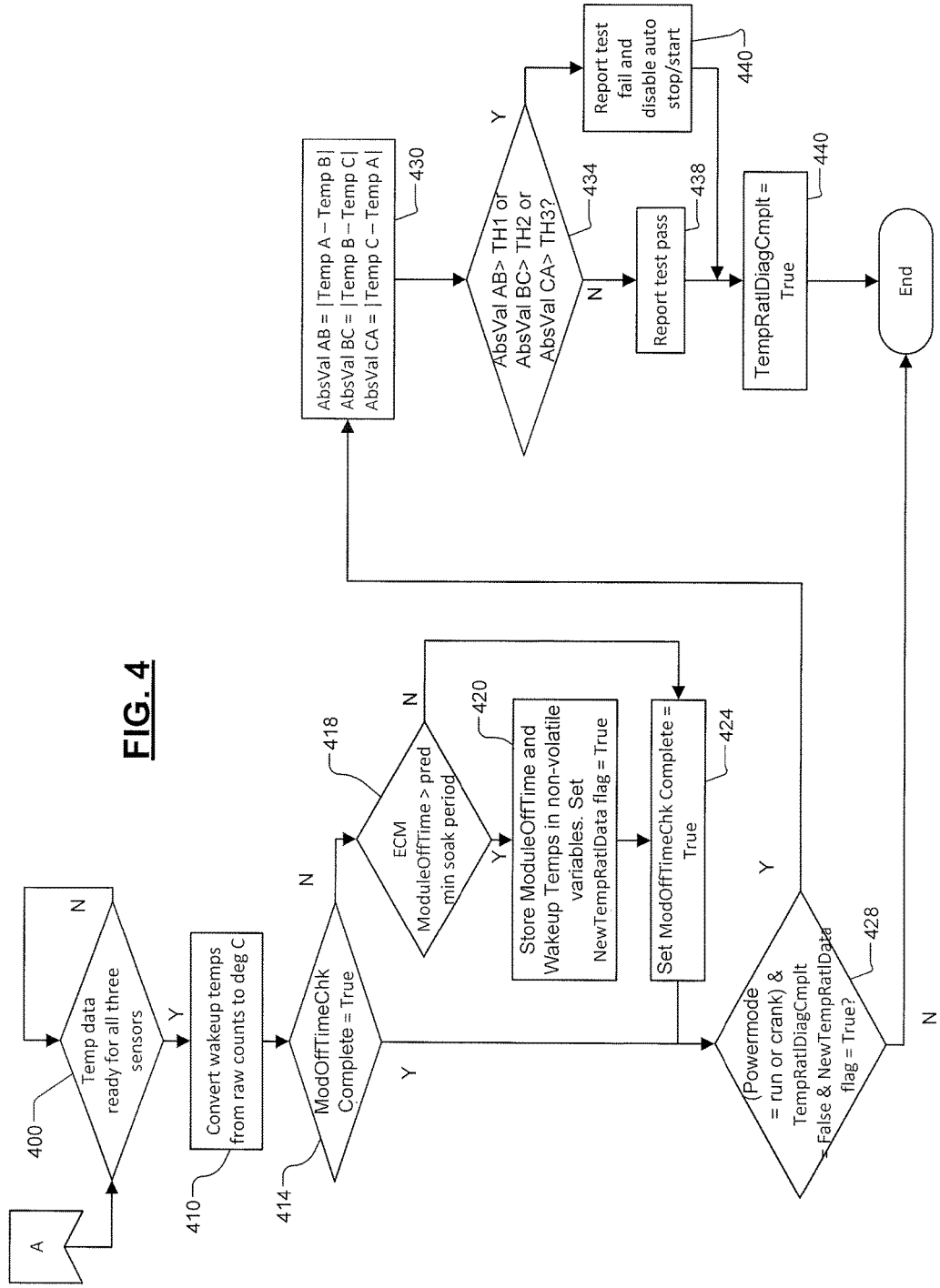
Figure 5:
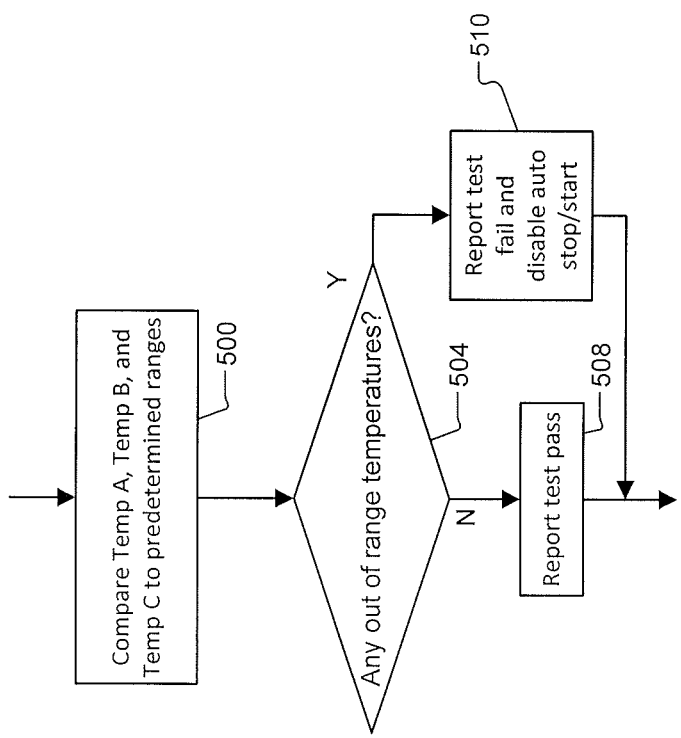

Referring now to FIGS. 3-5, a method 300 for monitoring temperatures of components of the ultra-capacitor system is shown. In FIG. 3, various steps are performed to ensure that the temperature data is current before running the diagnostic. At 310, control begins when the engine control module (ECM) wakes up. At 312, control determines whether a power mode is at accessory (ACC), run or crank. If not, control returns to 312. If 312 is true, control determines whether bus variables are initialized at 316. If not, the bus variables are initialized at 318. At 320, a next message received flag is set to false and control returns to 312.

When 316 is true, control monitors bus message received status. The next message received flags will change to true when the next frame arrives over the bus. At 326, control determines if the bus awake flag is set equal to true. If 326 is false, control continues with 328 and determines whether a new bus message is received. If 328 is false, control continues with 320. If 328 is true, control continues with 330 and sets the bus awake flag equal to true and continues with 320. When 326 is true, control continues with 334 and determines whether an ultra-capacitor controller wake delay is greater than a predetermined wake period. If 334 is false, control increments the ultra-capacitor controller wake delay timer at 326 and continues with 320.

When 334 is true, control determines whether the next message received flag is true (corresponding to a new temperature data record received from the bus). This and subsequent steps in FIG. 3 occur for each of the temperature sensors 218, 220 and 222. At 342, control determines whether the wake-up temperatures captured flag is equal to true. If not, control continues with 344 and captures wake-up temperatures. In some examples, the wake-up temperatures may be in raw counts or another temperature scale. Once the wake-up temperatures are captured, the wake-up temperature captured flag is set equal to true and control continues with 342. When 342 is true, control continues with 350 and sets all circuit signal status bits equal to ready.

In FIGS. 4-5, data conversion and temperature analysis is performed. At 400, control determines whether temperature data is ready for all of the temperature sensors 218, 220 and 222. If 400 is false, control continues with 400. If 400 is true, control continues with 410 and converts wake-up temperatures from raw counts to another temperature scale such as degrees Celsius. At 414, control determines whether a ModOffTimeChk complete flag is set to true.

If 414 is false, control continues with 418 and determines whether an ECM module off time is greater than a predetermined minimum soak period. If 418 is true, control continues with 420 and stores module off time and wakeup temperatures in nonvolatile variables and sets a new temperature rational data flag equal to true. At 424, control sets the module off timer check complete flag equal to true. If 418 is false, control continues with 424.

At 428, control determines whether the power mode is equal to run or crank AND the temperature rational diagnostic complete flag is equal to false AND new temperature rational data flag equal to true. If 428 is false, control ends. If 428 is true, control continues with 430 and determines the absolute value of temperature differences between the sensors 218, 220 and 222. At 434, control determines whether any of the absolute values of the temperature differences are greater than corresponding thresholds. The thresholds for each of the differences may be the same or different. If 434 is true, control reports a test fail and disables auto stop/start for the trip at 440. If 434 is false, control reports a test pass at 438. Control continues from 438 and 440 with 442 where the temperature rational diagnostic complete flag is set equal to true.

In FIG. 5, additional temperature checks may be performed to determine whether the temperature values of the temperature sensors 218, 220 and 222 are within predetermined corresponding ranges. The ranges may be the same or different for the different sensors. At 500, control compares the temperatures of the sensors to the predetermined temperature ranges. At 504, control determines whether any of the measured temperatures are out of range. If 504 is true, control reports a test fail and disables auto stop/start for the trip at 510. If 504 is false, control reports a test pass at 508. The steps performed in FIG. 5 may be performed along with the steps performed in FIG. 4.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A system comprising:
an ultra-capacitor and battery system comprising a battery, an ultra-capacitor, a DC-DC converter, a first temperature sensor to sense a battery temperature, a second temperature sensor to sense an ultra-capacitor temperature, and a third temperature sensor to sense a DC-DC converter temperature;
an engine control module that is configured to control operation of an engine;
an auto stop/start module configured to selectively stop and restart an engine of a vehicle while an ignition system is ON based on operating parameters; and
a temperature sensing module that communicates with the auto stop/start module and that is configured to determine differences between temperatures sensed by the first temperature sensor, the second temperature sensor, and the third temperature sensor by comparing the temperatures sensed by the first temperature sensor, the second temperature sensor, and the third temperature sensor to a first predetermined range, a second predetermined range, and a third predetermined range, respectively, after the engine control module determines that an engine off time is greater than a predetermined engine-off period and to selectively disable the auto stop/start module based on the comparison of the differences only after the engine control module determines that the engine off time is greater than the predetermined engine-off period.

2. The system of claim 1, further comprising:
a first switch having a first terminal connected to the battery and a second terminal connected to chassis ground;
a second switch having a first terminal connected to the battery and a second terminal connected to the ultra-capacitor; and
an ultra-capacitor controller configured to control the first switch and the second switch.

3. The system of claim 1, wherein the differences are absolute values.

4. The system of claim 3, wherein the temperature sensing module compares the differences to predetermined difference thresholds.

5. The system of claim 1, wherein the ultra-capacitor and battery system further comprises an ultra-capacitor controller.

6. The system of claim 5, further comprising:
the engine control module including the auto stop/start module and the temperature sensing module; and
a bus arranged between the engine control module and the ultra-capacitor controller.

7. The system of claim 6, wherein the engine control module is further configured to determine whether a wake-up temperatures captured flag is equal to true and is configured to capture wake-up temperatures sensed by the first temperature sensor, the second temperature sensor, and the third temperature sensor when the wake-up temperatures captured flag is not equal to true.

8. The system of claim 7, wherein the engine control module is further configured to convert the wake-up temperatures sensed by the first temperature sensor, the second temperature sensor, and the third temperature sensor from a first scale to a second scale.

9. The system of claim 6, wherein the engine control module is configured to determine whether bus variables received from the bus are initialized after the engine control module determines that a power mode is at least one of accessory (ACC), run, and crank.

10. A method comprising:
providing an ultra-capacitor and battery system comprising a battery, an ultra-capacitor, a DC-DC converter;
determining that an engine off time is greater than a predetermined engine-off period;
sensing a battery temperature, an ultra-capacitor temperature, and a DC-DC converter temperature;
selectively performing auto stop/starts by stopping an engine of a vehicle and restarting the engine of the vehicle while an ignition system is ON;
determining differences between the battery temperature, the ultra-capacitor temperature, and the DC-DC converter temperature when the engine off time is greater than a predetermined engine-off period by comparing the battery temperature, the ultra-capacitor temperature, and the DC-DC converter temperature to a first predetermined range, a second predetermined range and a third predetermined range, respectively; and
selectively disabling the auto stop/starts based on the comparison of the differences.

11. The method of claim 10, wherein the differences are absolute values.

12. The method of claim 11, further comprising comparing the differences to predetermined thresholds.

13. The method of claim 10, further comprising:
determining whether a wake-up temperatures captured flag is equal to true; and
capturing wake-up temperatures sensed by a first temperature sensor, a second temperature sensor, and a third temperature sensor when the wake-up temperatures captured flag is not equal to true.

14. The method of claim 13, wherein determining that the engine off time is greater than the predetermined engine-off period further comprises determining, upon entering a power-on mode, that the engine off time is greater than the predetermined engine-off period.

15. The method of claim 14, further comprising upon entering the power-on mode and determining that a bus awake flag is set to true indicating that a data frame was received over a bus arranged between an engine control module and an ultra-capacitor controller, determining whether a wake delay of the ultra-capacitor controller is greater than a predetermined period.

16. A method, comprising:
providing an ultra-capacitor and battery system comprising a battery, an ultra-capacitor, a DC-DC converter;
determining that an engine off time is greater than a predetermined engine-off period;
sensing a battery temperature, an ultra-capacitor temperature, and a DC-DC converter temperature;
selectively performing auto stop/starts by stopping an engine of a vehicle and restarting the engine of the vehicle while an ignition system is ON;
determining differences between the battery temperature, the ultra-capacitor temperature, and the DC-DC converter temperature when the engine off time is greater than a predetermined engine-off period by comparing the temperatures sensed by a first temperature sensor, a second temperature sensor, and a third temperature sensor to a first predetermined range, a second predetermined range, and a third predetermined range, respectively;
selectively disabling the auto stop/starts based on the comparison of the differences;
determining whether a wake-up temperatures captured flag is equal to true;
capturing wake-up temperatures sensed by the first temperature sensor, the second temperature sensor, and the third temperature sensor when the wake-up temperatures captured flag is not equal to true, wherein determining that the engine off time is greater than the predetermined engine-off period further comprises determining, upon entering a power-on mode, that the engine off time is greater than the predetermined engine-off period; and
upon entering the power-on mode and determining that a bus awake flag is set to true indicating that a data frame was received over a bus arranged between an engine control module and an ultra-capacitor controller, determining whether a wake delay of the ultra-capacitor controller is greater than a predetermined period,
wherein capturing wake-up temperatures further comprises capturing wake-up temperatures sensed by a first temperature sensor, a second temperature sensor, and a third temperature sensor when the wake-up temperatures captured flag is not equal to true and the wake delay is greater than the predetermined period.

* * * * *